United States Patent
Blyth et al.

[19]

[11] Patent Number: 5,969,987
[45] Date of Patent: Oct. 19, 1999

[54] NON-VOLATILE ELECTRICALLY ALTERABLE SEMICONDUCTOR MEMORY FOR ANALOG AND DIGITAL STORAGE

[75] Inventors: Trevor Blyth, Milpitas; Richard T. Simko, Los Altos Hills, both of Calif.

[73] Assignee: Information Storage Devices, Inc., San Jose, Calif.

[21] Appl. No.: 09/243,566

[22] Filed: Feb. 3, 1999

Related U.S. Application Data

[62] Division of application No. 08/509,348, Jul. 31, 1995.

[51] Int. Cl.⁶ ................................................ G11C 7/00
[52] U.S. Cl. ................................ 365/185.03; 365/185.19; 365/189.07
[58] Field of Search ........................ 365/185.03, 189.07, 365/185.19

[56] References Cited

U.S. PATENT DOCUMENTS

| | | | |
|---|---|---|---|
| 4,627,027 | 12/1986 | Rai et al. | 365/45 |
| 4,698,787 | 10/1987 | Mukherjee et al. | 365/185 |
| 4,890,259 | 12/1989 | Simko | 365/45 |
| 4,989,179 | 1/1991 | Simko | 365/45 |
| 5,021,999 | 6/1991 | Kohda et al. | 365/168 |
| 5,029,130 | 7/1991 | Yeh | 365/185 |
| 5,045,488 | 9/1991 | Yeh | 437/43 |
| 5,067,108 | 11/1991 | Jenq | 365/185 |
| 5,164,915 | 11/1992 | Blyth | 365/45 |
| 5,202,850 | 4/1993 | Jenq | 365/185 |
| 5,218,569 | 6/1993 | Banks | 365/189.01 |
| 5,220,531 | 6/1993 | Blyth et al. | 365/189.07 |
| 5,241,494 | 8/1993 | Blyth et al. | 365/45 |
| 5,242,848 | 9/1993 | Yeh | 437/43 |
| 5,278,087 | 1/1994 | Jenq | 437/43 |
| 5,289,411 | 2/1994 | Jeng et al. | 365/185 |
| 5,294,819 | 3/1994 | Simko | 257/314 |
| 5,537,358 | 7/1996 | Fong | 365/218 |
| 5,583,812 | 12/1996 | Harari | 365/185.03 X |
| 5,615,153 | 3/1997 | Yiu et al. | 365/185.19 |

FOREIGN PATENT DOCUMENTS 57176598  10/1982  Japan .

*Primary Examiner*—Do Hyun Yoo
*Attorney, Agent, or Firm*—Blakely, Sokoloff, Taylor & Zafman LLP

[57] ABSTRACT

Methods and apparatus for achieving analog storage in a non-volatile memory array. The array consists of memory cells that utilize Fowler-Nordheim tunneling for erasure and hot electron injection for programming. Writing into a cell is performed by an initial erasure followed by a controlled sequence of program operations during which the cell is programmed in small increments. The stored voltage is read after each program step and when the voltage read back from the cell is equal or just beyond the desired analog level, the sequence of program steps is terminated. The read condition for the cell applies a positive voltage to the drain or common line and a positive voltage to the control gate. The source is connected through a load device to a negative (ground) supply. The output from the cell is the actual voltage that exists at the source node. There is no current sensing or comparison with a reference voltage to determine the output state. A digital number can be represented by assigning a specific analog level to a digital number. The range of digital numbers that can be represented is determined by the analog voltage range divided by the accuracy to which the voltage may be stored and reliably retrieved. Other aspects and features of the invention are disclosed.

8 Claims, 9 Drawing Sheets

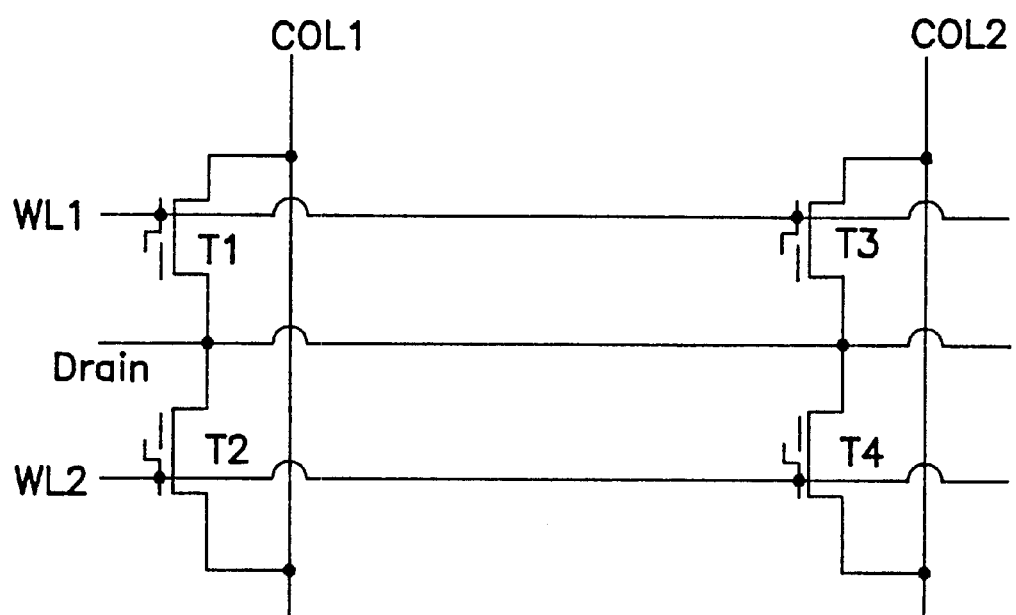
FIG. IA

NON-VOLATILE ELECTRICALLY ALTERABLE SEMICONDUCTOR MEMORY FOR ANALOG AND DIGITAL STORAGE

This is a divisional application of application Ser. No. 08/509,348, filed on Jul. 31, 1995.

BACKGROUND OF THE INVENTION

1. Field of the Invention

This invention relates to the field of integrated circuit storage of analog signal samples and multi-level digital signals in a memory array.

2. Prior Art

Up to the present time, nonvolatile analog storage in integrated circuits has been performed predominantly in EEPROM memory cells that utilize Fowler-Nordheim electron tunneling for both erase and program modes. These cells are usually constructed of a MOS transistor with an intermediate polysilicon gate positioned between the channel and an upper polysilicon control gate. The intermediate polysilicon gate does not have any ohmic electrical connections, is completely surrounded by an insulator and is commonly termed the floating gate. Electrical charge is added to or subtracted from the floating gate by applying voltages to the four available terminals of the transistor (source, drain, gate and substrate) such that electric fields are imposed across a particular region of the dielectric surrounding the floating gate, generally called the tunnel oxide. By correct three dimensional design of the cell, and by correct selection of applied voltages, the fields across the tunnel oxide are sufficiently high to induce electron tunneling through the dielectric. The addition or removal of electrons to or from the floating gate causes the threshold of the transistor, as measured by applying a voltage to the upper control gate, to be modified. Assuming NMOS transistors are used, the direction of the high electric field determines whether electrons tunnel onto or off the floating gate and therefore determines whether the resulting change in threshold voltage is an increase or a decrease, respectively.

There are many examples of floating gate digital memories, whereby the threshold voltage of the floating gate transistor is changed by significant amounts, in the order of a few volts. One logic state is represented by a wide range of thresholds and the other logic state(s) is represented by a different range(s) of thresholds. Information is read from the cell generally by determining whether the transistor conducts or does not conduct when the transistor is biased into a predetermined read condition. Analog storage, on the other hand, requires that small or continuous changes be made to the threshold of the floating gate transistor, and requires that the reading of the transistor give a determination of an actual voltage from the transistor, or an indication of how conductive the transistor is. Examples of analog storage can be found in U.S. Pat. Nos. 4,627,027 (Rai), 4,890,259 (Simko), 4,989,179 (Simko), 5,220,531 (Blyth), 5,241,494 (Blyth), and 5,294,819 (Simko).

The technique utilized in U.S. Pat. No. 4,627,027 relies on a programming voltage applied through a high value resistor to the drain of the floating gate transistor such that the transistor starts to conduct when the floating gate is charged sufficiently high, relative to an applied analog level on its source. At the onset of conduction the drain current causes an increasing voltage drop across the resistor and therefore reduces the programming voltage applied to the drain. Tunnel current therefore reduces and the floating gate reaches a level which has a close relationship to the input voltage on the source.

U.S. Pat. No. 4,890,259 and U.S. Pat. No. 4,989,179 describe a non-volatile memory array of cells into which analog or multi-level signals are stored by continuously sampling the signal and sequentially temporarily storing the samples in a set of sample and hold circuits. The parallel outputs from the sample and hold circuits are then used to control an iterative write sequence for an equal number of memory cells, the iterative write sequence being independent for each of the cells as controlled by the respective sample and hold output. The iterative write sequence is a series of write programming voltage pulses, each followed by a read operation, wherein the programming voltage pulses increase in amplitude until the voltage level read from the cell matches the desired analog level from the corresponding sample and hold circuit, at which time the series of programming pulses for that cell is terminated. U.S. Pat. No. 5,220,531 and U.S. Pat. No. 5,241,494 are improved methods and apparatus for iterative analog storage that allow improved performance and manufacturability. U.S. Pat. No. 5,294,819 is a method for analog storage in an EEPROM cell containing a single transistor. A common characteristic of the aforementioned examples is the use of an EEPROM cell that uses Fowler-Nordheim tunneling for both erase and program modes of operation.

Another class of non-volatile memories relies on hot-electron injection for the program operation. Erasure may be performed by exposing the surface of the integrated circuit to Ultra Violet light, or alternatively may be performed electrically by Fowler-Nordheim tunneling. In either case the program function is performed by hot electron injection, whereby the floating gate transistor of the selected cell is biased such that electrons in the source to drain channel are subjected to high electric fields. The energy imparted to the electrons is sufficiently high for electrons to jump the energy gap of the oxide layer and terminate on the floating gate. The proportion of electrons terminating on the floating gate depends on the particular bias conditions, one of which is the floating gate voltage and therefore the field across the oxide under the floating gate. Generally speaking, high source currents are required to supply sufficient charge transport to program an adequate threshold change in a reasonable time period i.e. a few volts in a few tens or hundreds of $\mu$sec. Transfer efficiency is therefore very low; in the order of 1 electron which terminates on the floating gate for $10^6$ or $10^7$ channel electrons. Since programming requires high currents and high voltages, the techniques used for on-chip voltage multiplication from a single power source such as those found on EEPROM devices are not practical, and it becomes necessary to use external power sources to supply the program current. A special external supply, capable of relatively high power, is a significant disadvantage. Some recent improvements, however, have overcome some of these difficulties. One example is described in U.S. Pat. Nos. 5,029,130, 5,067,108 and 5,289,411 —an improved technique for hot electron injection, whereby the programming transfer efficiency is much improved, and on-chip voltage multiplication becomes practical. While the above patents disclose the manufacture of the improved device and its operation and use for digital data, the present invention relates in the preferred embodiment to storage of analog data, and also introduces different techniques for writing to and reading from the cell. This invention can also be applied to other types of non-volatile cells that use hot electron injection. In addition, while the present invention uses sample and hold circuits and iterative programming techniques similar to those disclosed in U.S. Pat. Nos. 4,890,259, 4,989,179 and 5,241,494, there are significant differences from these patents. Briefly, the program control is performed by switching current instead of voltage, as well as significant architectural differences in the writing circuits.

BRIEF SUMMARY OF THE INVENTION

The present invention discloses methods and apparatus for achieving analog storage in a non-volatile memory array. The array consists of memory cells that utilize Fowler-Nordheim tunneling for erasure and hot electron injection for programming.

The input level to be stored may be a voltage that is applied continuously during the programming period, or, in a typical application of this invention, it may be an output from one of a plurality of sample and hold circuits that continuously sample an analog signal and provide a steady voltage for use by the writing circuits during the programming period. Writing into a cell is performed by an initial erasure followed by a controlled sequence of program operations during which the cell is programmed in small increments. The stored voltage is read after each program step and when the voltage read back from the cell is equal or just beyond the desired analog level, the sequence of program steps is terminated. The number of program steps may be different for each cell or for different desired voltages. The program configuration and conditions depend on the type of cell being used, but in any case, the change in floating gate transistor threshold during each program step must be small. This is achieved by controlling the applied voltages, the source to drain current and also the time for which the source current flows. A combination of all the above control variables may be required for a particular cell type.

The read condition for the cell is different from that used in the classic digital configuration. Assuming NMOS devices, usually in the prior art the source of the cell, i.e. the common line, is connected to the negative (ground) supply and the voltages applied to the control gate and drain are positive with respect to the source. The stored state of the cell is determined by sensing the resulting drain current. Alternatively, a load device is connected between the drain and a positive supply and the data state or states determined by the drain voltage being greater or less than a reference voltage or set of voltages. In contrast, the present invention applies a positive voltage to the drain or common line and a positive voltage to the control gate. The source is connected through a load device to a negative (ground) supply. The output from the cell is the actual voltage that exists at the source node. There is no current sensing or comparison with a reference voltage to determine the output state.

As mentioned above, a typical application of the invention is the sampling and storing of an analog waveform. In particular, the invention is especially effective in the recording and playback of audio waveforms. To achieve adequate voice reproduction quality, a sample rate of 6 KHz or greater is required. The resulting time period of 170 microseconds, or less, is too short to allow lengthy sequences of iterative programming steps, especially if high resolution and therefore a large number of steps is required. Prior art U.S. Pat. No. 4,890,259 uses sample and hold circuits and parallel writing circuits to allow sufficient programming time, while U.S. Pat. No. 5,220,531 reduces the number of parallel writing circuits to more practical numbers. The improved writing technique in the '531 patent relies on temporary storage of a programming voltage on a cell by cell basis and does not lend itself easily to hot electron programming. However, the present invention introduces a method and architecture for reducing the number of parallel writing circuits that is suitable for hot electron programming and therefore reduces circuit complexity, die size and cost of manufacture.

Digital information storage is another application for the present invention. A digital number can be represented by assigning a specific analog level to a digital number. The range of digital numbers that can be represented is determined by the analog voltage range divided by the accuracy to which the voltage may be stored and reliably retrieved. To input a digital number to the device, a digital word is input to an analog to digital (A/D) converter and the output of the converter is stored in the analog memory. At the output of the device, the analog level is retrieved from memory and input to a digital to analog (D/A) converter. The output of the D/A is a digital number that corresponds to the number that was originally input to the device. One embodiment of the present invention is an array of analog memory cells. Combining the analog memory array with the storage of digital information provides a very dense storage for digital information.

BRIEF DESCRIPTION OF THE DRAWINGS

FIG. 1A is a circuit diagram of an arrangement of transistors for illustrating and describing read, erase and program operations of the preferred embodiment of the present invention.

DETAILED DESCRIPTION OF THE INVENTION

FIG. 1A is a circuit diagram of a transistor arrangement intended to demonstrate the various operating modes of the preferred embodiment of the present invention, and shows four single transistor cells connected in an arrangement of two rows and two columns. While this specific arrangement has very limited practical application, it does serve to illustrate the method for reading, erasing and programming in a representative, albeit minimal size memory array, and is representative of larger arrays of any desired size achieved by replicating the arrangement of FIG. 1A, as shown in FIG.

1B. In particular, in FIG. 1B, the array of FIG. 1A has been replicated twice horizontally and twice vertically to provide an array of 4 columns by 4 rows of cells, with the drain connections of each pair of adjacent rows being coupled in common to a respective drain driver line. This of course is representative of the manner in which the basic array of FIG. 1A can be repetitively replicated to provide an array of any desired size and configuration.

Figure 2:
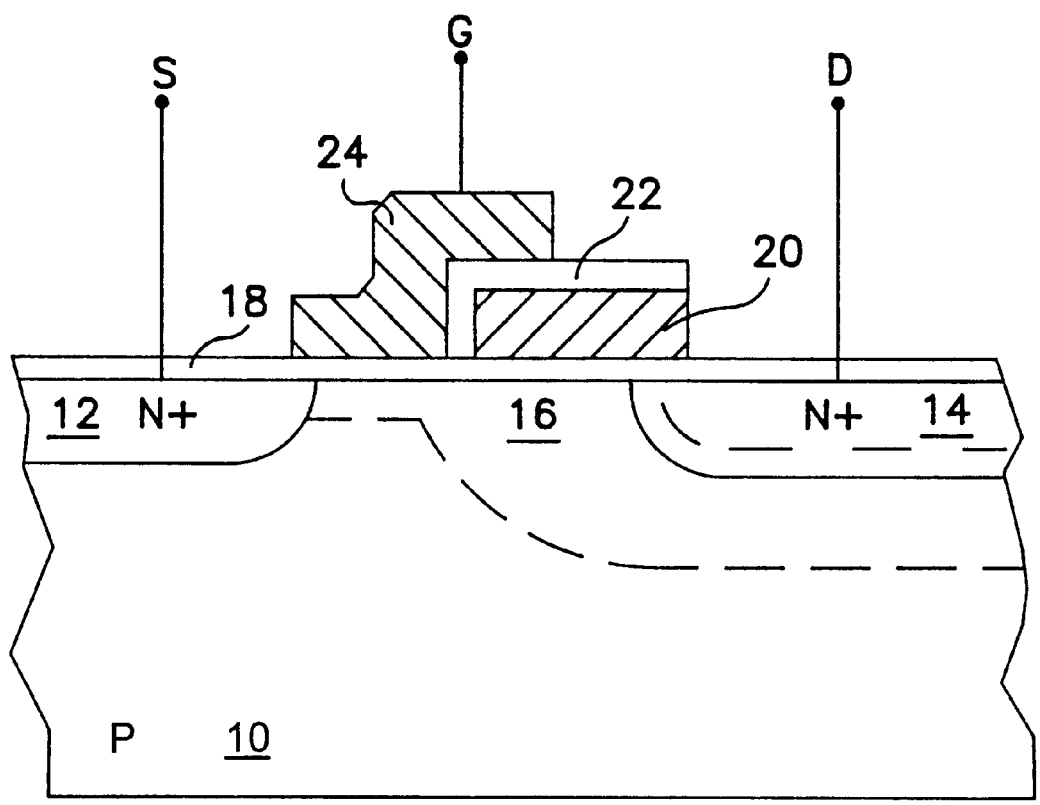
FIG. 2 is a cross section of a prior art single transistor electrically programmable and erasable memory cell of the type that can be used in the circuit of FIG. 1A-1B.

In the interest of simplicity, the following discussion assumes that all floating gate transistors are NMOS rather than PMOS transistors. In addition, the discussion will use, by way of example, the cell structure described in U.S. Pat. No. 5,029,130. This cell structure is illustrated in cross section in FIG. 2. As shown, the P substrate 10 has N+ source and drain regions 12 and 14, respectively. The source and drains regions as well as the channel region 16 there between are covered by a first insulating layer 18 such as silicon dioxide of a thickness of approximately 70 to 200 Angstroms. Disposed over the insulating layer 18 is a floating gate 20 positioned over a portion of the channel region 16 and a portion of the drain region 14. Disposed adjacent and over the floating gate 20 is another insulative layer 22, with a control gate 24 disposed over the insulative layer 22 so as to extend over part of the floating gate 20, adjacent the control gate 24, and over part of the channel region 16 and part of the source region 12. Further details of this particular cell and its construction can be found in the patent herein before referred to.

The techniques introduced in the present invention, however, may be utilized by other hot electron cell structures, preferably, but not necessarily, with high program current efficiency. If a different type of cell is used, then the bias conditions for the erase, program and read operations would need to be modified. Cells that have poor efficiency may require extra external power supplies, more complicated waveform regulation circuits and larger switching transistors, and may be limited in the number of cells that may be practically programmed in parallel, thus impacting sample rate and device architecture. A cell type with high transfer efficiency is therefore preferred.

Suppose that transistor T1 in FIG. 1a is the selected cell for an erase, program and read operation. Table 1 provides a list of representative applicable node voltages. Erase is performed by applying a high voltage, about 15 V, to the control gate WL1 and 0 V to all other terminals. The capacitive coupling between control gate and floating gate, for this type of cell, is much less than the sum of the coupling between floating gate and other terminals and therefore a high electric field is created across the dielectric between control gate and floating gate. Electrons tunnel from the floating gate to the control gate, resulting in a net positive charge on the floating gate after the control gate is returned to a low level. For a 15 V erase pulse applied for 1 msec, the threshold of T1 is reduced to about −1 V. Since the control gate is common to all transistors on the row, both transistors T1 and T3 are erased. There are no applied voltages to T2 and T4, so there is no change to the charge on the respective floating gates and therefore no change in the threshold of T2 and T4.

Alternate cell types, such as described in U.S. Pat. No. 4,698,787, would achieve similar results by raising the drain voltage to a high level while maintaining the control gate at a low level. The erase operation results, again, in tunneling of electrons from the floating gate, except this time the tunnel direction is towards the drain.

The cell T1 is read by connecting a voltage of approximately 5 V to WL1, a load current of about 1 $\mu$A from 0 V to Col1, and 2.5 V to the drain line. This configuration creates a source follower action in which changes to the voltage on the floating gate, created during erase and program, are manifested directly as changes to the source voltage during read. The load current is kept low in order to maximize the voltage range on the source for a given change in the floating gate voltage, and also to reduce distortion effects that would otherwise be created by current loading in the floating gate transistor and the switching transistors that are necessary to implement a usable array.

TABLE 1

| | | Operating Conditions | | | |
|---|---|---|---|---|---|
| Operation | WL1 | WL2 | Col1 | Col2 | Drain |
| Erase | 15V | 0V | 0V | 0V | 0V |
| Read | 5V | 0V | 1 $\mu$A to 0V | open | 2.5V |
| Program | 2V | 0V | 1 $\mu$A to 0V | 3V–5V | 6V–12V |
| Program Inhibit | 2V | 0V | 3V–5V | 3V–5V | 6V–12V |

Cell WL1/Col1 selected, all other cells deselected.
Substrate potential is 0V for all operations.

Programming is performed by biasing the floating gate transistor such that electrons flowing in the source/drain channel are subjected to high fields, causing them to gain sufficient energy to pass through the energy gap. A certain proportion of these "hot electrons" are collected on the floating gate, depending on the cell efficiency. The cell in this example achieves high efficiency by concentrating the high field in a short region of the channel, just underneath the interface between the control gate and the floating gate. The control gate is taken to approximately 1 or 2 volts, so as to very weakly invert the underlying channel. Simultaneously a high voltage, between 6 V to 12 V, is applied to the drain.

Since the floating gate is positively charged from the erase operation and, in addition, the drain couples additional positive charge onto the floating gate, the channel under the floating gate is strongly inverted. The potential drop between source and drain is concentrated in a short distance under the sidewall oxide, separating the control gate and floating gate, resulting in high fields and therefore high transfer efficiency, as described in U.S. Pat. No. 5,029,130. A current controlled sink of about 1 $\mu$A is connected to the source and applied for a short period in the order of a few microseconds. By minimizing the source current, starting with a low drain voltage, and also minimizing the length of time that the source current flows, the present invention reduces the amount of programming charge that passes through the oxide and therefore reduces the change in threshold voltage to a small value, in the order of a few millivolts. Repetitive program operations are performed, each one changing the threshold by a small amount. Between program events, the cell is read in regular intervals to determine if programming is to continue or is to be terminated.

As programming continues, the floating gate becomes progressively negatively charged and tends to reduce the injection efficiency. Compensation for the efficiency loss is achieved by increasing the drain voltage between program steps. The amount of drain voltage increase per program step is of the same order as the floating gate decrease so that the change in floating gate voltage per program step is essentially constant over the complete voltage range. In this example, the drain voltage in increased, in small steps, from about 6 V to about 12 V. The threshold voltage of T1 increases in correspondingly small steps until, at the end of the programming sequence the threshold has increased, from its starting point of −1 V to about 5 V. The voltage output in the read mode changes from about 2.5 V to 0 V. Thus an analog voltage has been stored in T1. Program termination can be achieved by removing the high voltage from the drain, or also by taking the Col1 line to 3 V to 5 V, thus raising the source voltage of T1 above the control gate by an amount higher than the effective gate drive on T1, even in its fully erased state. Current conduction in the T1 channel is turned off and programming stops.

The possible disturb conditions that exist during programming of T1 can be analyzed by considering T2, T3 and T4 of FIG. 1A. These three transistors are unselected for programming during programming of T1, and any change in threshold is undesirable. WL2 is at 0 V, therefore turning off the channel conduction of T2 and T4. Col2 is at a high voltage relative to WL1 and, in a similar manner to the program inhibit condition, there is no channel current and therefore no injection or change in threshold for transistor T3.

The number of program iterations is determined by the desired resolution, or voltage output change per program step, together with the voltage range or dynamic signal range of the voltage to be stored. A combination of small resolution increments and large dynamic range is desirable for good noise performance and good audio reproduction. This unfortunately requires a large number of program steps. For instance, a signal range of 2.5 V and a resolution of 10 mV requires 250 program pulses. In addition, the exact cell characteristics vary from cell to cell, not only on a single integrated circuit die or wafer, but also from wafer to wafer and especially across different manufacturing lots. An extended range of high voltage drain voltages is therefore used in order to take different cell characteristics into consideration. The beginning voltage on the drain node is chosen to be a value lower than that considered to be the lowest nominal value required to program the maximum stored voltage. By this means, margin is added to ensure that the first program step does not cause a change to the floating gate charge that is larger than our desired step size. Similarly, the maximum drain voltage reached during programming is increased such that cells which are more difficult to program can still be programmed to the minimum stored voltage. If cell characteristics are assumed to vary by ±30%, then a total of 400 program pulses would be required.

Another consideration is the rate at which an input waveform is sampled; in the interest of reproduction quality, a high sample rate is preferred. However, as the sample rate is increased for a given number of sample and hold circuits, the available time period for storage of the sampled voltages decreases. (For applications other than audio recording, the equivalent parameter is write speed, or write access time). Now, since storage requires the cell to be connected alternately between program and read configurations, there is a practical minimum time limit during which the cell can be re-configured from one configuration to another. Large memory arrays, in particular, have considerable load capacitances that the peripheral circuits can only charge and discharge to the required bias voltages in a certain, finite time period. The cell read operation also requires a certain settling time period for the readback voltage to stabilize. The product of the time required for a single program step, times the total number of program steps must be equal or less than the product of the sample period times the number of sample and hold circuits or column drivers.

Figure 3:
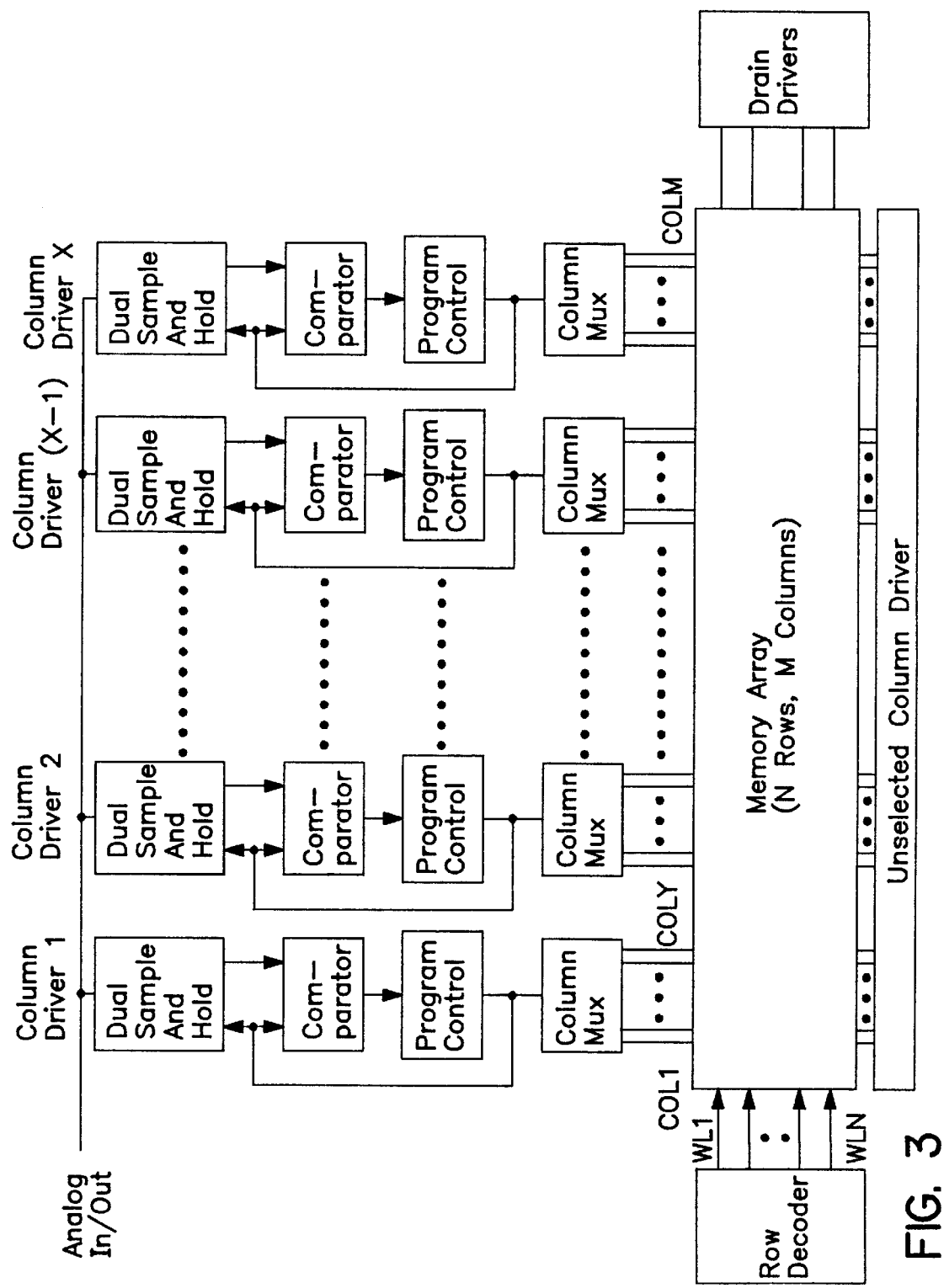
FIG. 3 is a block diagram illustrating the memory array architecture of the preferred embodiment of the present invention.

This concept can be better understood by considering FIG. 3, which, in similar fashion to U.S. Pat. No. 4,890,259, shows a memory array architecture with N rows, M columns and X sample and hold circuits. As an audio signal is continuously sampled into one bank of capacitors in the dual sample and hold circuits, the other bank is being written in parallel into the array. Each time the writing of a bank is completed, the column multiplex circuit connects the next group of column lines into the column driver. When all cells in a row have been written, the row decoder selects the next row. Thus, the time taken to load a bank of sample and hold circuits is the maximum time available for writing the previous bank into the array.

As the number of program steps is increased and/or the length of time for a program/read/compare sequence increases, so does the number of column drivers, X, need to increase for a given sample rate. Undesirable consequences are twofold. Firstly, silicon area required to hold the extra column drivers is greater, and secondly the increased hold time in the sample and hold circuits leads to increased capacitor area, circuit complexity, or reduced performance due to signal leakage and distortion. A further attribute of the present invention includes a method to reduce these problems by reducing the average time to perform a program step. The basic concept is to read the cell and then apply a group of several program pulses to the cell before reading it again. As the voltage presently stored in the cell is read, a determination is made as to how many, out of a maximum number of program steps, should be applied during the next group. By this means the number of times that the cell configuration is changed from read to program and program to read is reduced approximately by the maximum number of program pulses in the group. The time spent charging or discharging nodes is reduced, as well as the total time spent to allow voltages to settle, thus improving the overall efficiency of the writing procedure.

Figure 4:
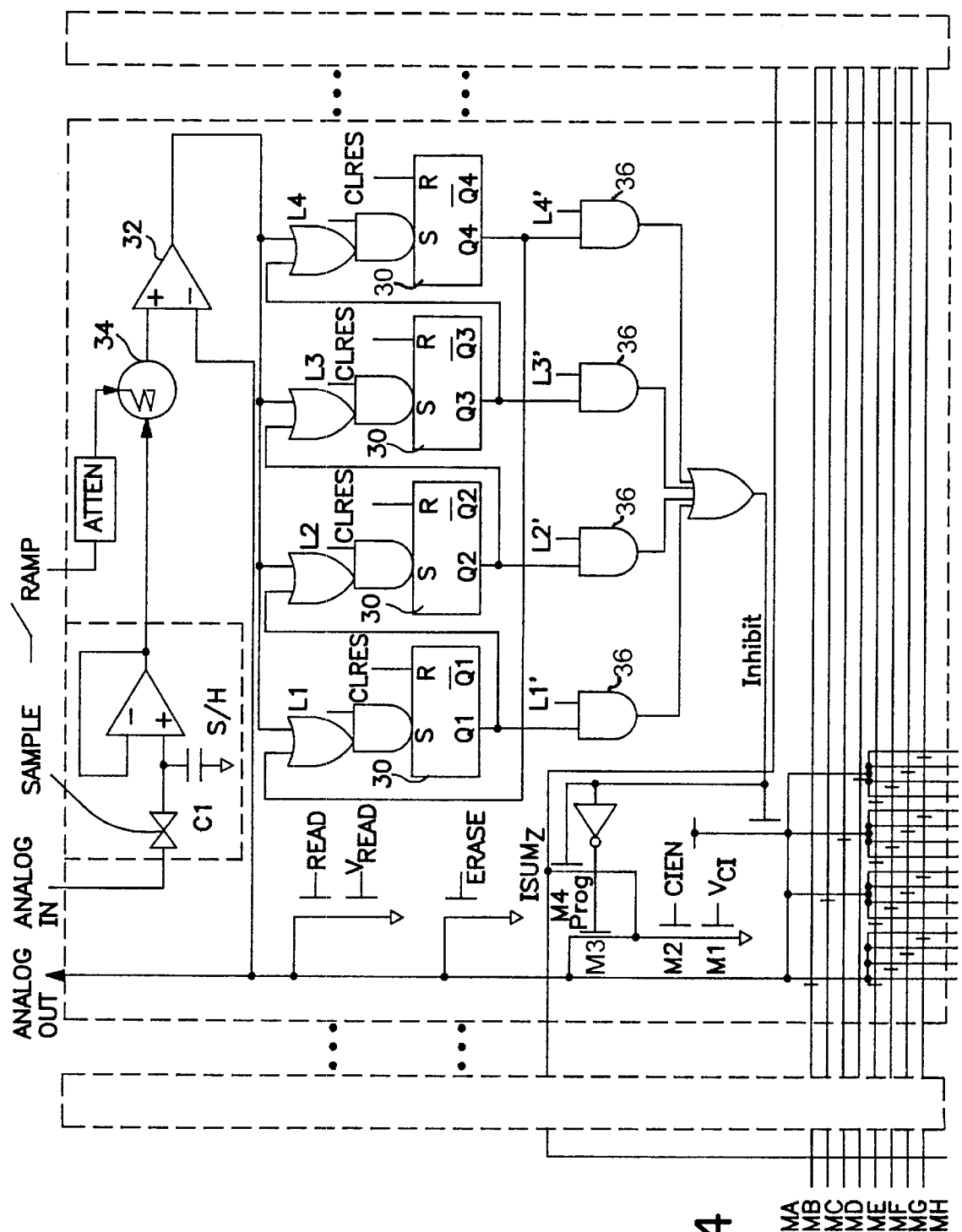
FIG. 4 is a circuit diagram providing the details of the program control circuit of the preferred embodiment of the present invention.
Figure 5:
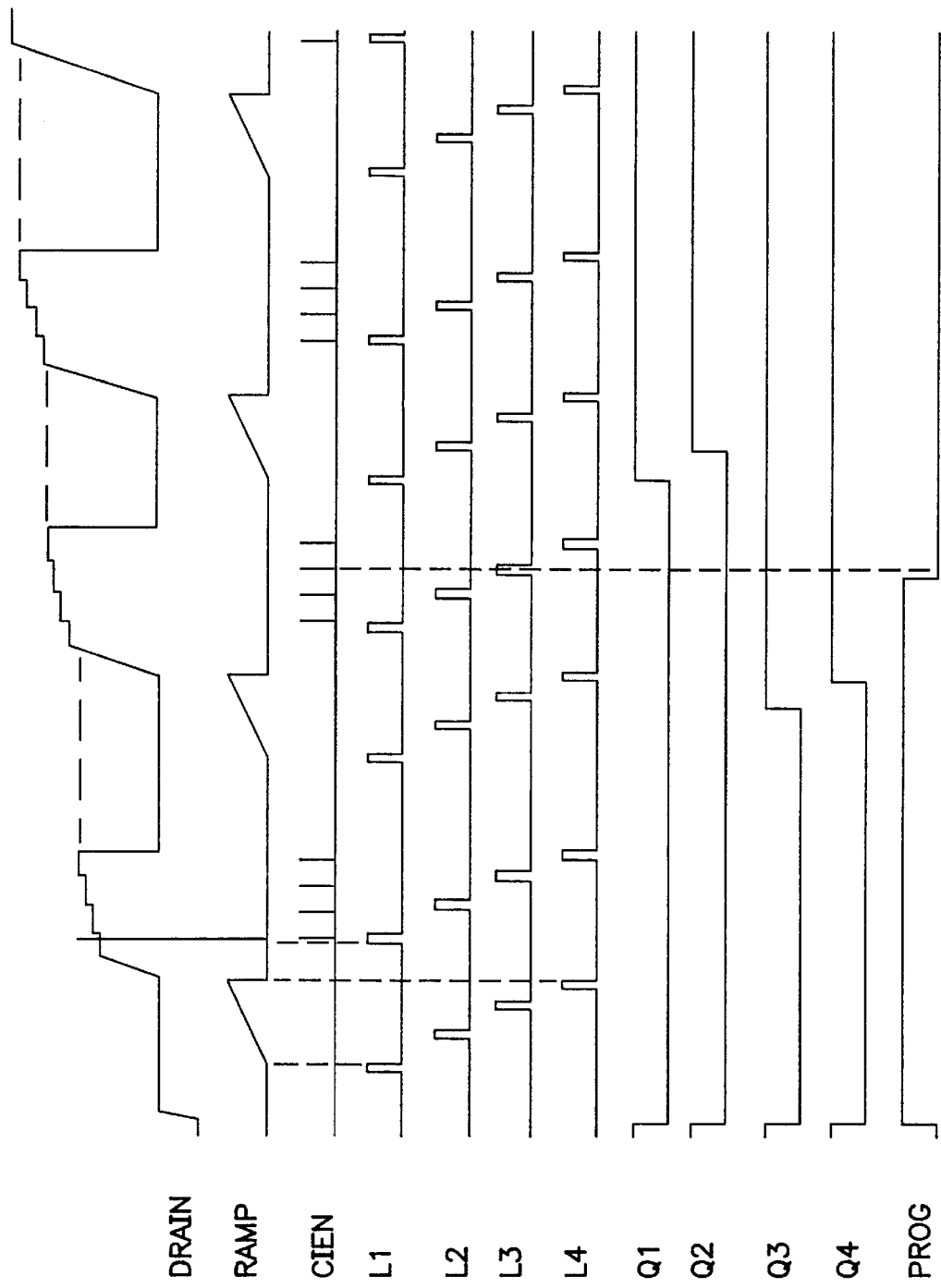
FIG. 5 is a timing diagram for the program control circuit of FIG. 4.

The circuit for doing this is shown in FIG. 4, together with a corresponding timing diagram in FIG. 5. In this particular implementation the program group consists of four pulses. Assume that the cell addressed by the active word line and by the active column multiplexer has already been cleared. A pulse has been applied to CLRES and, consequently, all latch 30 outputs Q1 through Q4 are at a logic "0". An input analog voltage is sampled and held on C1. The buffered voltage is summed with an attenuated ramp voltage and then input to a comparator 32. The ramp voltage and the attenuator 34 are designed such that the peak input to the summing node after attenuation is equal to the change in cell read voltage that is achieved by three program pulses. The other input to the comparator is the Analog Out signal, i.e. the voltage read from the addressed cell. As the ramp voltage increases, the signals L1, L2, L3 and L4 (which may also constitute signals L1', L2', L3' and L4' to AND gates 36) sequentially enable the latches and, if the cell voltage is less than the sum of the hold voltage plus the attenuated ramp voltage, then the corresponding latch 30 outputs Q1, Q2, Q3 or Q4 is set. Thus the amount of analog programming still to be performed is represented by the outputs of the digital logic positioned between the comparator 30 and the program current steering switches. If there is no comparison, as is the case when the addressed cell has not been sufficiently programmed, and all latches 32 remain reset, then during the next drain high voltage pulse, the INHIBIT signal remains low. The switching transistor M2, controlled by logic signal CIEN, connects the 1 $\mu$A fixed current from transistor M1 biased as a 1 $\mu$A current source, through M3 onto the selected column line during each of the four CIEN pulses. The cell is subjected to all four program current pulses and its threshold increases accordingly. Notice that the drain voltage increases such that, during each successive CIEN pulse, the drain voltage is higher by an amount corresponding to the program resolution. The drain node may increase incrementally, as shown in FIG. 5, or it may increase steadily in a ramp during each group of four successive CIEN pulses.

The repetitive program/read procedure repeats until, in a subsequent read operation, the cell is found to approach the final, desired voltage and a comparison is obtained during one of the pulses L1 through L4. The particular pulse depends on how much additional programming is required to achieve a cell voltage equal to the held voltage. For instance, the ramp voltage is zero during L1, so if a comparison is achieved at this time, it means that the cell voltage has reached the target. All latches 30 would be set and therefore, during the next program cycle, the INHIBIT signal disables all further program current pulses. The example shown in the timing diagram of FIG. 5 shows a comparison during L3, i.e. when the ramp has reached a level equivalent to two program steps. On the next program cycle the cell receives two current pulses, bringing the stored voltage up to the desired level. Once the desired level has been reached, all further program pulses are inhibited until the next cell is selected. In the particular circuit implementation shown in FIG. 4, the cross-coupling of the latch outputs to the input of the next latch ensures that once any latch is set, all subsequent strobe periods will also set the corresponding latch. Latches will remain set until the next cell is addressed, at which time they will be reset by CLRES.

It is possible to implement the latching and cross-coupling in various ways. The overall objective is to add some form of hysterisis so that, once a comparison is made and the program pulses are inhibited, the pulses remain inhibited until the next cell is selected. There are many ways to implement this hysterisis, in either digital or analog form. In fact, if noise levels are sufficiently low, it is even possible to eliminate the coupling between latches entirely so that, once the first comparison has been made, the circuit relies on the comparator output to make sure that all other latches are set. Other variations are possible. For instance, the number of pulses within a group may be modified. A larger number of pulses provides greater benefit in terms of reduced overall program time for a given resolution, but requires a more accurate correspondence between the voltage increments on the drain during programming and the ramp during reading which sets the number of program pulses within the group to be used in the next programming cycle. To aid in attaining this accuracy, programmability may be added to the circuitry to allow adjustment at the time of manufacture of the appropriate parameter to obtain accurate correspondence between the voltage increments on the drain during programming and the ramp during reading. One or more digital floating gate storage cells may be added on chip to allow programming, at the time of manufacture, of the slope of the ramp used during the reading phase of the program/read/compare sequence, or the rate of increase of the program pulse voltages applied to the drain during programming. Such cells can be programmed at the die or wafer stage when circuit contacts can be directly made to achieve the desired result. Alternatively such cells can be made electrically accessible through already existing pins on the integrated circuit by driving another pin to a voltage outside its ordinary operating range to reset on-chip switches determining pin functions. The general use of such trim bits for trimming circuit parameters is well known in the prior art, and need not be further described herein.

Figure 1B:
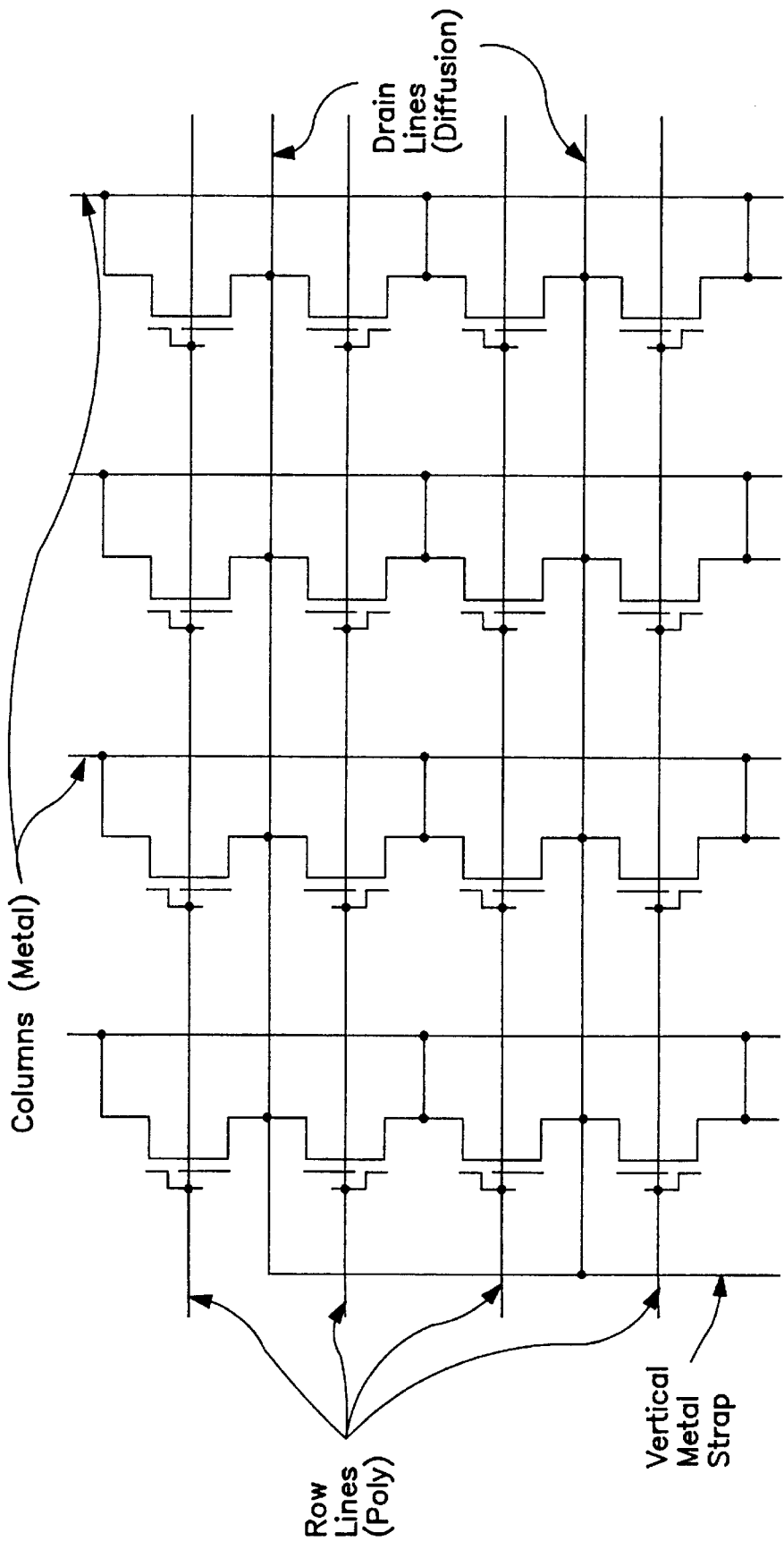
FIG. 1B is a circuit diagram of a portion of a typical memory array in accordance with the present invention attainable by the replication of the circuit of FIG. 1A.

As a further alternate embodiment, note from FIG. 1B that with respect to each drain line, there is a row of cells above the drain line and another row of cells below the drain line. Mask alignment, which is necessarily imperfect, will effect the "up" cells differently from the "down" cells. To compensate for this, the ramp may actually consist of two ramps, one that is used for "up" cells and another used for "down" cells. Allowance can therefore be made for mask alignment related differences in the cell characteristics of odd and even rows. Each ramp could be adjusted separately, or one adjustment could be for the average ramp slope and the other for the differential ramp slope.

The schematic diagram of FIG. 4 is a representation of the logical functions only, not a detailed circuit, as an actual MOS implementation would require certain obvious signal inversions. Also the latches and logic that represent the number of program pulses to be performed in the next pulse group can be effectively implemented with a counter. While FIG. 4 represents an exemplary embodiment, a person skilled in the art will recognize that several other variations are possible, all of which will achieve essentially the same result.

Figure 6:
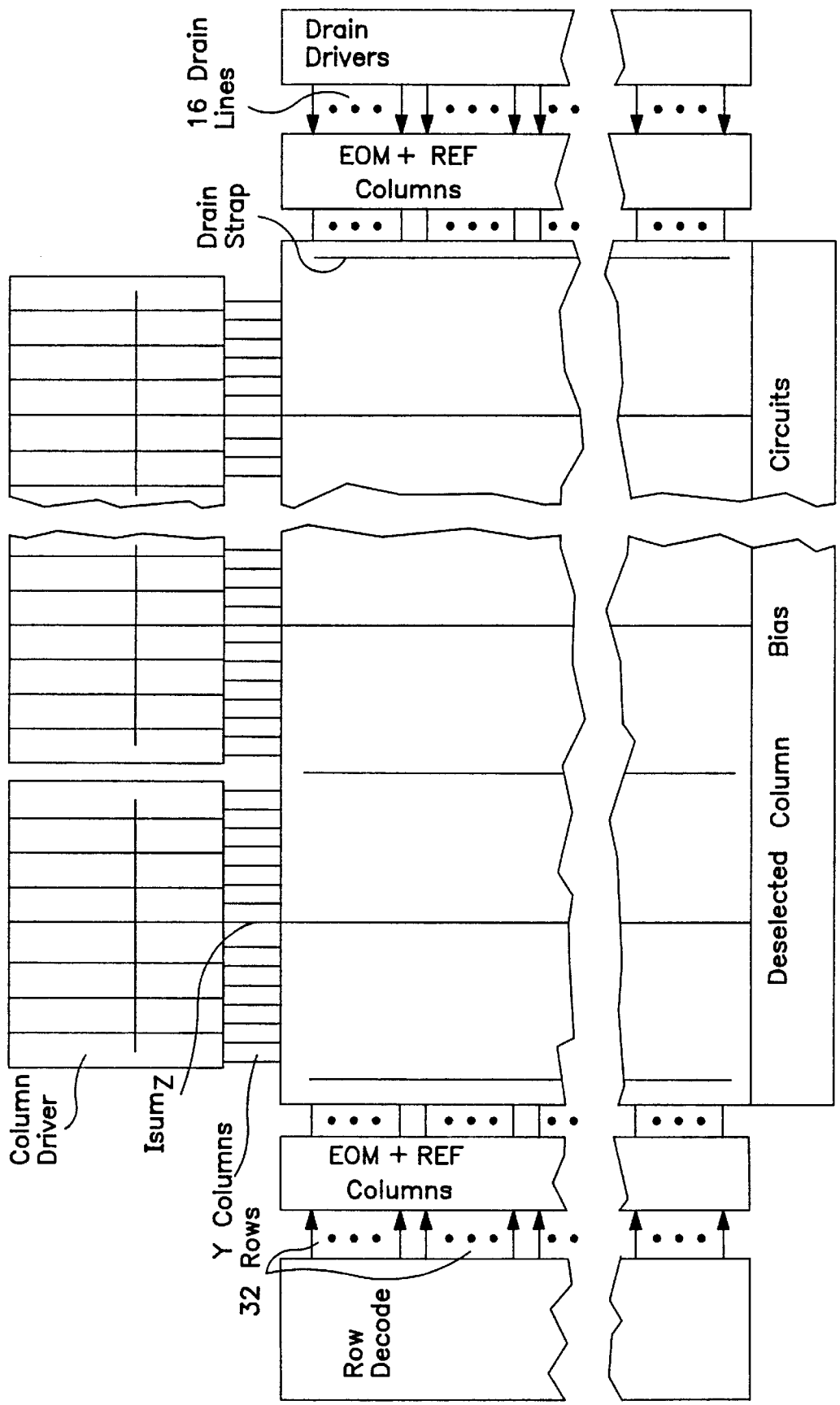
FIG. 6 is a schematic diagram illustrating the overall analog memory organization of the preferred embodiment of the present invention, and particularly showing the drain straps and ISUMz lines.

Provision is made in the current switching circuits to route the program current into the memory array, even when programming is to be inhibited. When transistor M3 turns off, transistor M4 turns on, current is directed not into a column line, but instead onto node ISUMz which, in turn, is connected to the drain node of the selected row, through a transistor which has its gate driven by the word line WLn (see also FIGS. 6 and 7). Several column driver circuits have the source of their respective M4 transistors connected in parallel and any column driver in the inhibit condition will sum its program current into ISUMz. The purpose is to minimize the change in voltage profile along the resistive drain line during the course of the program operation. The voltage change would occur due to the change in current flowing through the drain line as cells reach the desired voltage and program current is terminated. Such a voltage change may cause unexpectedly large amounts of programming at a particular cell, as cells in other parts of the array reach their desired level and their program current is terminated. By redirecting current into ISUMZ, the overall current flowing through the drain node is constant. Thus the local voltage profile change due to the switching of M3 transistors is minimized compared to an architecture that does not use ISUMz. FIGS. 3 and 6 illustrate the memory organization. There are a total of M columns, organized with Y columns per column driver. If there are Z instances of the node ISUMz, then it follows, for each ISUMz node, there are M/Z columns and M/(Z×Y) column drivers. For instance, with a total of 2048 columns, organized as 16 columns per column driver and a total of 128 column drivers, one could assign 8 column drivers to each one of 16 ISUMz nodes. Note also that this effect relates to the uniformity of the programming increment which is obtained for different cells or groups of cells. An example is the case of all cells in a group being programmed versus the last (single) cell being programmed, and also the case of the first bank of cells in a row versus the last bank of cells being programmed. Any remaining non uniformity can be tolerated so long as the maximum programming increment is limited to no more than the desired increment.

An additional benefit of the present invention is the reduced drain capacitance being charged at any one time. The reduction is achieved by separating the drain node into separate nodes for each pair of cell rows. When switching back and forth between program and read modes in the program/read/compare analog storage sequence, the reduced capacitance allows faster charging and shorter program times. However, a serious disadvantage for analog storage is the increased drain line resistance, which, as described above, can have undesirable effects on the voltage profile along the drain line and may result in unwanted increases in programming increments.

Figure 7:
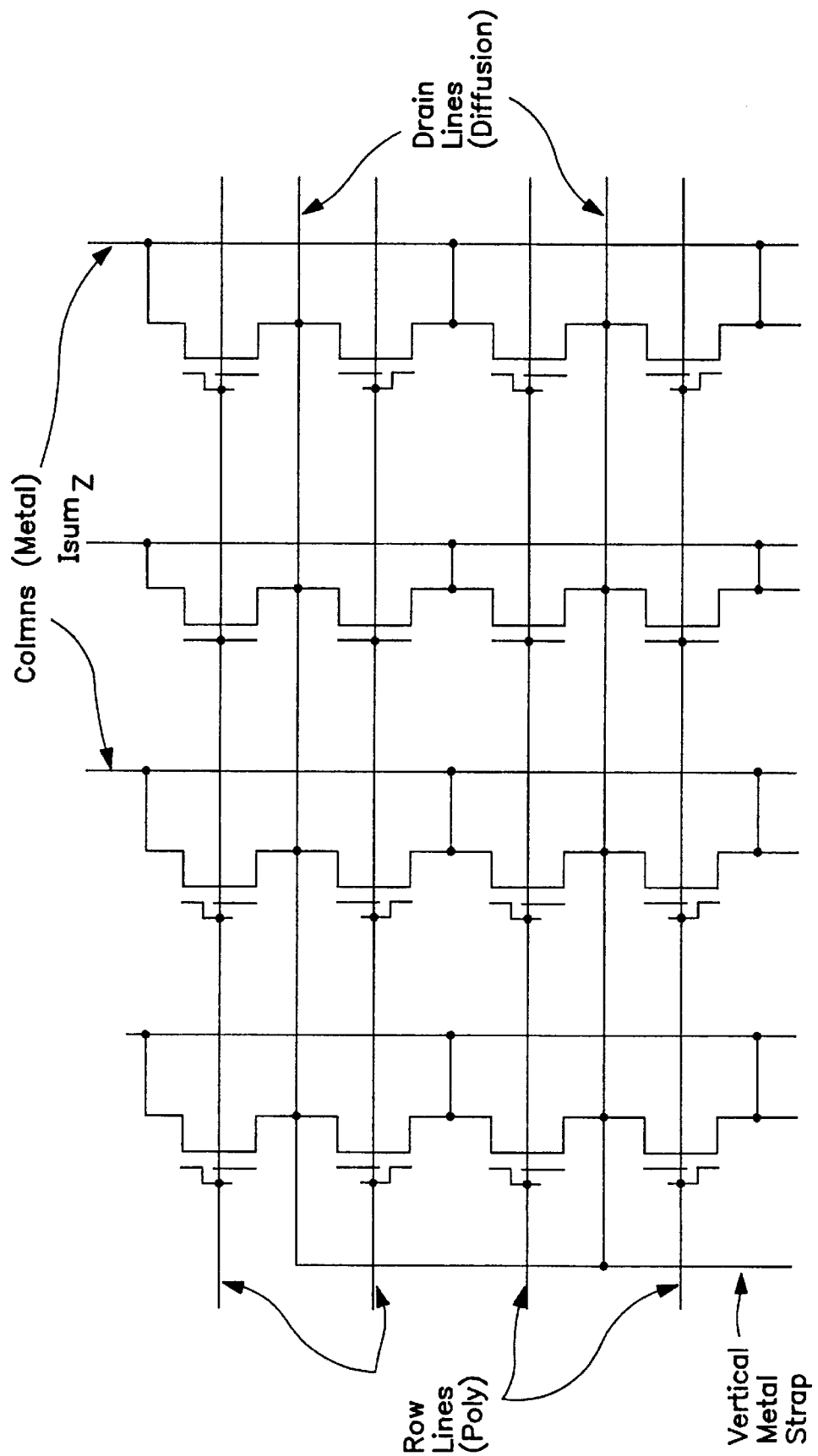
FIG. 7 is a circuit diagram of a portion of a typical memory array in accordance with the present invention illustrating the coupling of the ISUMz lines to the drain lines through corresponding transistor switches.

To compensate for this effect, a further improvement is introduced in the present invention which results in a reduction in the effective resistance of the drain connection. In particular, several drain lines are connected together by a metal connection running parallel to the column direction and contacting several drain lines which run perpendicular to the columns. These drain straps are schematically illustrated in FIGS. 6 and 7. As more rows are connected together, the effective drain resistance across the array is reduced because of the increased parallel connections. This allows more accurate analog programming due to the reduction of voltage changes along the drain line. Of course, as more drain lines are connected together, the drain capacitance increases, as does the program disturb. A trade-off must be made between the accuracy of analog programming, disturb and charge up time. A suitable number of drain lines to connect together may be 32 rows. In an array of, say, 1600 rows, the benefits of capacitance reduction and disturb reduction are considerable (approximately 50 times less than if all rows are connected) compared to a single drain line, yet the resistance reduction is also significant (approximately 32 times).

Figure 8:
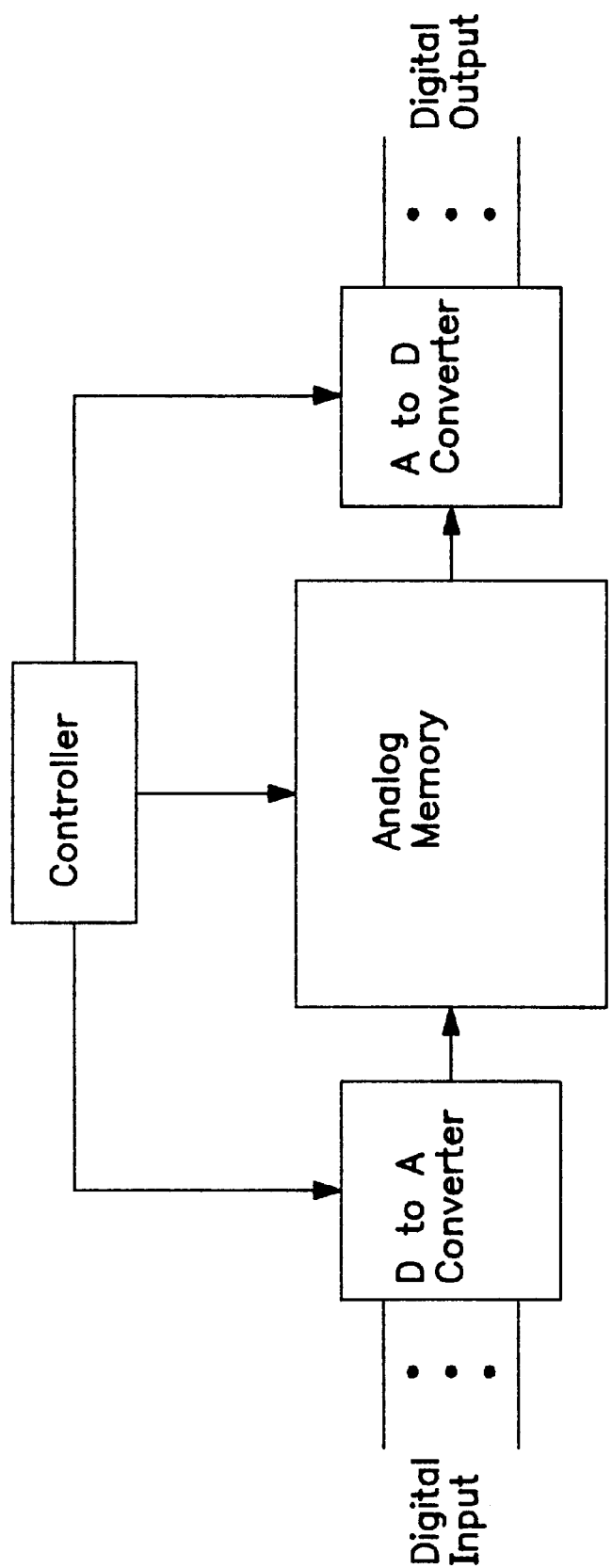
FIG. 8 illustrates the connection of data converters to the analog memory to provide the storage and playback of a multi-bit digital value as a single analog voltage.

Representation of digital numbers is achieved by the addition of an A/D converter at the input and a D/A converter at the output. FIG. 8 is an illustration of the connection of the data converters to the analog memory. The magnitude of the number, or the number of bits in the digital word, is given by the voltage range of the stored analog level, divided by the guaranteed accuracy of storage. The accuracy of storage considers, not only the increment during the programming sequence, but also factors such as noise, worst case programming increment, long term voltage retention characteristics of the cell and the effects of ambient temperature and operating voltage. An analog memory of the type described in the present invention is able to resolve a voltage to about 10 millivolts over a range of 2.5 Volts. While this allows about 250 distinct levels and representation of 8 bits of binary information, after consideration of the above factors, the number of bits may be reduced to, say, 4 bits (16 levels spaced approximately 150 millivolts apart). Nevertheless, 4 bits to a single cell provides a significant improvement in the information storage density that can be achieved in a memory array, compared to the conventional digital storage which provides for only 1 bit per cell.

While preferred embodiments of the present invention have been disclosed and described herein, it will be obvious to those skilled in the art that various changes in form and detail may be made therein without departing from the spirit and scope of the invention.

what is claimed is:

1. A method of programming a predetermined analog voltage into an analog voltage storage cell by executing a plurality of program/read/compare operations for incrementally programming the storage cell by program pulses until a read operation reads out a voltage substantially equal to the predetermined analog voltage comprising:

(a) for each compare operation of a program/read/compare cycle, estimating the amount of programming remaining to be done until the read operation reads out the voltage substantially equal to the predetermined analog voltage; and (b) for each program operation following the compare operation of act (a), incrementally programming the storage cell by a number of program pulses responsive to the amount of the programming remaining to be done as determined in act (a).

2. The method of claim 1 wherein the number of program pulses that may be used in act (b) comprises a number ranging from zero to a predetermined maximum number.

3. The method of claim 1 wherein an accuracy of a correspondence between voltage increments on a drain of the storage cell during programming and a signal added to the read voltage during reading, which sets the number of program pulses within a group to be used in the next programming cycle, is adjusted at the time of manufacture of the analog voltage storage cell.

4. The method of claim 1 wherein for each read operation, the analog voltage storage cell is connected as a source follower wherein changes to a voltage of a floating gate of the storage cell during programming are manifested directly as source voltage changes of the storage cell during the read operation.

5. Apparatus for programming a predetermined analog voltage into an analog voltage storage cell by executing a plurality of program/read/compare operations for incrementally programming the storage cell by program pulses until a read operation reads out a voltage substantially equal to the predetermined analog voltage comprising:

circuitry for estimating the amount of programming remaining to be done for each compare operation of a program/read/compare cycle until the read operation reads out the voltage substantially equal to the predetermined analog voltage; and circuitry for incrementally programming the storage cell for each program operation following the compare operation by a number of program pulses responsive to the amount of th programming remaining to be done.

6. The apparatus of claim 5 wherein the circuitry for incrementally programming the storage cell for each program operation following the compare operation by a number of program pulses comprises circuitry for incrementally programming the storage cell for each program operation following the compare operation by the number of program pulses ranging from zero to a predetermined maximum number.

7. The apparatus of claim 5 further comprising programmable circuitry for adjusting, at the time of manufacture of the analog voltage storage cell, an accuracy of a correspondence between voltage increments on a drain of the storage cell during programming and a signal added to the read voltage during reading which sets the number of program pulses within a group to be used in the next programming cycle.

8. The apparatus of claim 5 further comprised of circuitry for connecting the analog voltage storage cell as a source follower for each read operation wherein changes to a voltage of a floating gate of the storage cell during programming are manifested directly as source voltage changes of the storage cell during the read operation.

* * * * *